US000001525H

United States Statutory Invention Registration [19]

[11] Reg. Number: H1525

[45] Published: Apr. 2, 1996

Geil et al.

[54] METHOD AND SYSTEM FOR HIGH SPEED PHOTOLITHOGRAPHY

[75] Inventors: Bruce Geil, Baltimore; Tim Mermagen, Havre de Grace, both of Md.

[73] Assignee: The United States of America as represented by the Secretary of the Army, Washington, D.C.

[21] Appl. No.: 45,341

[22] Filed: Apr. 8, 1993

[51] Int. Cl.[6] ..... G03B 27/52; G03B 27/32; G03C 5/00

[52] U.S. Cl. ..... 355/44; 355/18; 359/36; 364/488; 364/489

[58] Field of Search ..... 364/488, 489

[56] References Cited

U.S. PATENT DOCUMENTS 4,653,860 3/1987 Hendrix ..... 350/336

5,045,419 9/1991 Okumura ..... 430/20

*Primary Examiner*—Bernarr E. Gregory

*Attorney, Agent, or Firm*—Freda L. Krosnick; Muzio B. Roberto; Frank J. Dynda

[57] ABSTRACT

A method and system for modification of a pattern on a semiconductor substrate, comprising the application of an electrical current through a liquid medium having a series of individual pixels controlled by a computer, thereby causing the clear liquid to change to opaque in selected areas.

3 Claims, 3 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD AND SYSTEM FOR HIGH SPEED PHOTOLITHOGRAPHY

The invention described herein may be manufactured, used, and licensed by or for the Government for Governmental purposes without the payment to us of any royalties thereon.

BACKGROUND OF INVENTION

1. Field of Invention

This invention relates to a method and system for the patterning wafers at high speed without the generation of a photomask.

2. Brief description of the Prior Art

In the production of integrated circuits, computer designed patterns are used to delineate areas on the circuit. For each item produced, up to twenty or more different patterns are used, i.e., one for each level of the circuit. There are currently two methods for transferring patterns onto semiconductor substrates.

The first method uses a glass plate with chrome and photosensitive layer on it. After the pattern is designed on the computer, a special camera is used to expose the photosensitive layer. The photosensitive layer is then developed and the chrome is etched away in the exposed area.

This mask is then used to pattern the intergrated circuit through the use of another camera. The camera aligns the photomask with the wafer and then floods the mask with light, allowing light only to pass through area where the chrome is removed, thus exposing the wafer. In this way the entire circuit is patterned all at one time. The advantage of this method is the speed in which the wafer can be exposed. In a production fabrication facility over 40 wafer are treated each hour for each for each patterning system.

A disadvantage of this system is that a new mask must be produced for each level of the circuit. This adds up to thousands of masks for a production facility. An other disadvantage is that the a new mask must be produced for any change of mask set.

Another method for patterning an integrated circuit is through the use of a beam writing tool. This tool uses a focused scan of particles, such as an electron beam, or an ion beam to expose the photosensitive material on the wafer. In this method, each circuit is exposed using a beam that is millions of times smaller than the area of the circuit. The beam then has to scan the entire surface area of the circuit. The advantage of this method is that the pattern being exposed on the wafer can be changed by varying the data fed into the beam writing tool. The need for creating a photomask first is eliminated. The disadvantage of the method is the speed at which the tool writes the patterns. With these systems, i.e., 6 wafers per hour can be run through the system. This is a problem in production where a level of 60 wafers per hour would be desirable.

SUMMARY OF INVENTION

The present invention relates to a system and method for patterning wafer at high speed without the generation of a photomask. The method uses a liquid crystal display (LCD) which is positioned between the layers of a plastic material. A series of wires extend from the plastic material into the LCD. A series of pixels are positioned at the bottom of the lower crystal materials. The pixels are controlled by a computer. The mask can either be contact printed directly on the circuit, or the image can be optically controlled.

OBJECTS OF THE INVENTION

It is an object of the invention to provide and disclose a method for the fabrication of semiconductor.

It is a further object of this invention to provide and disclose a system for the fabrication of semiconductors obviating the need for a different pattern for each level of the circuit.

It is a further object of this invention to provide and disclose a method for the fabrication of a semicoductor wherein the mask can be contact printed directly on the circuit.

It is a further object of the invention to provide and disclose a method for the fabrication of a semiconductor wherein the image can be optically controlled.

Other objects and a fuller understanding of the invention may be ascertained from the following drawings, description and claims.

DESCRIPTION OF PREFERRED EMBODIMENT

The present invention proposes the use of a modifiable mask for the production of intergrated circuits. This method uses a computer to change the mask as required. The mask can be changed as often as needed.

Figure 1:
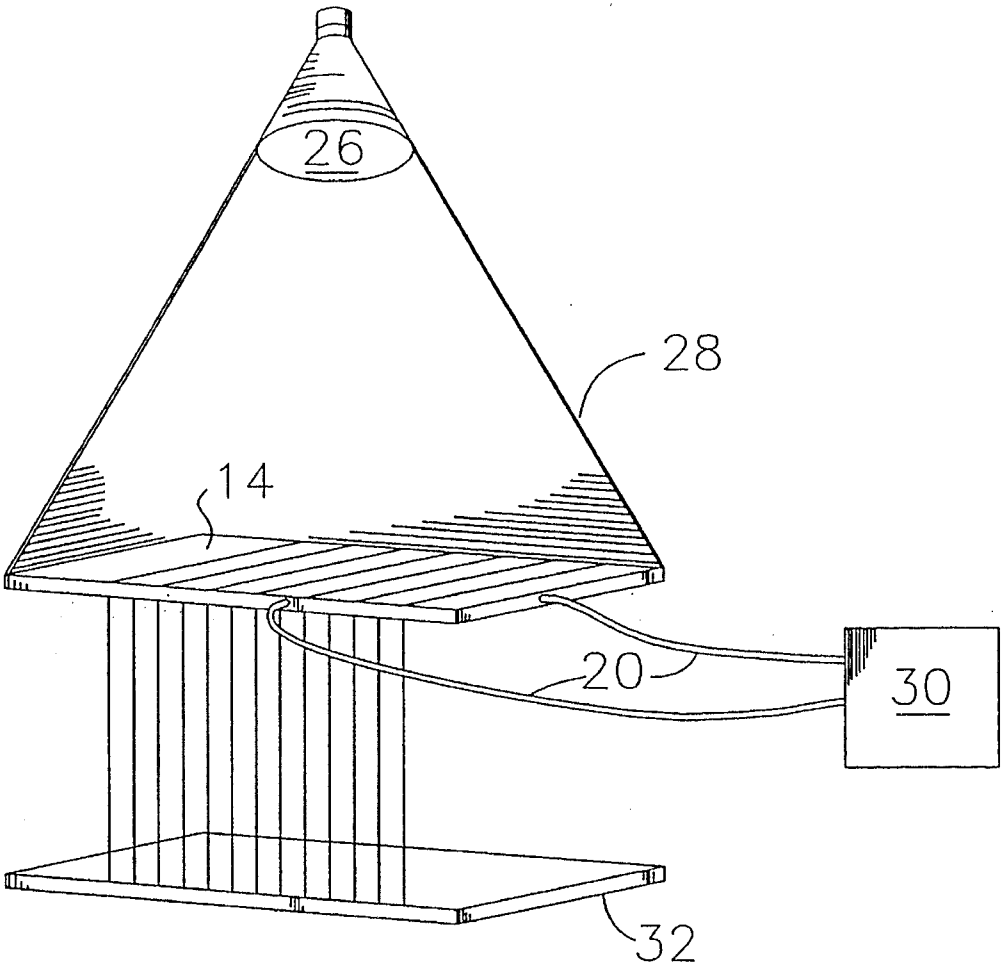
FIG. 1 is schematic view of the system utilized to carry out the invention.
Figure 2:
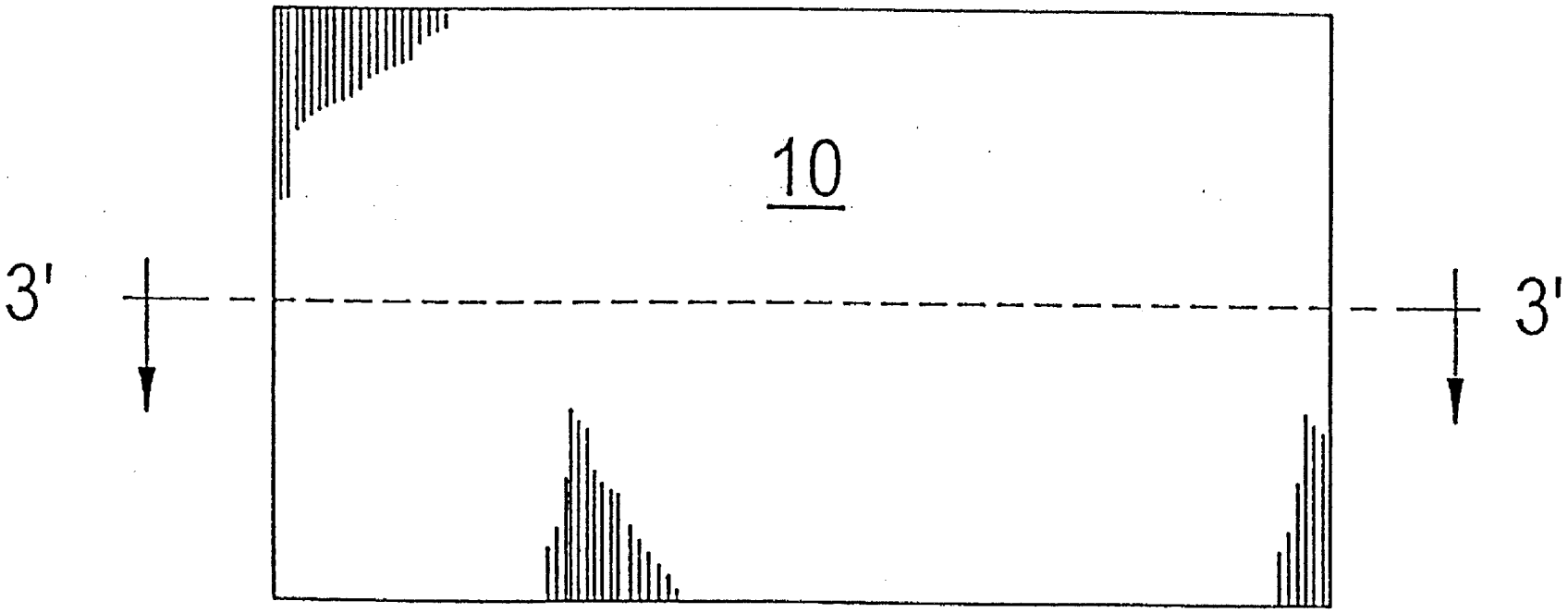
FIG. 2 is a plan view of the LCD component of FIG. 1.
Figure 3:
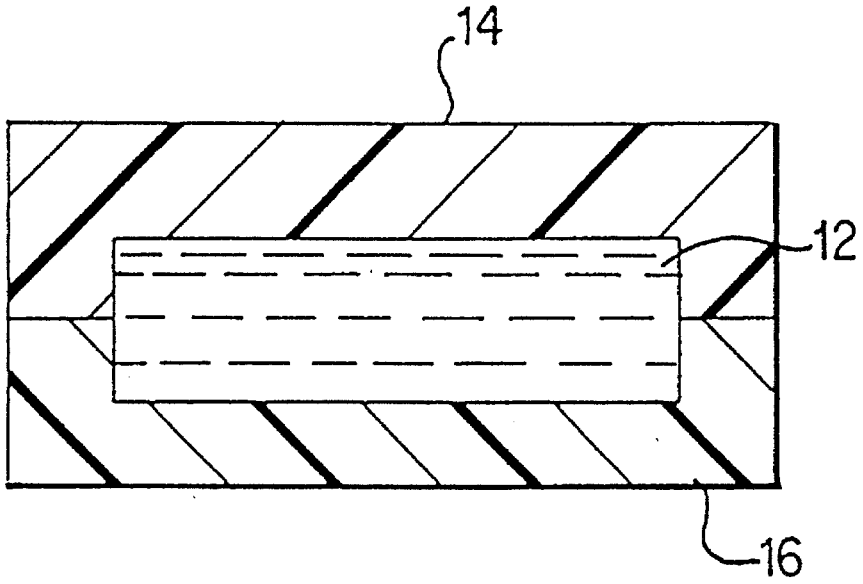
FIG. 3 is a sectional view 3'—3' of FIG. 2.
Figure 4:
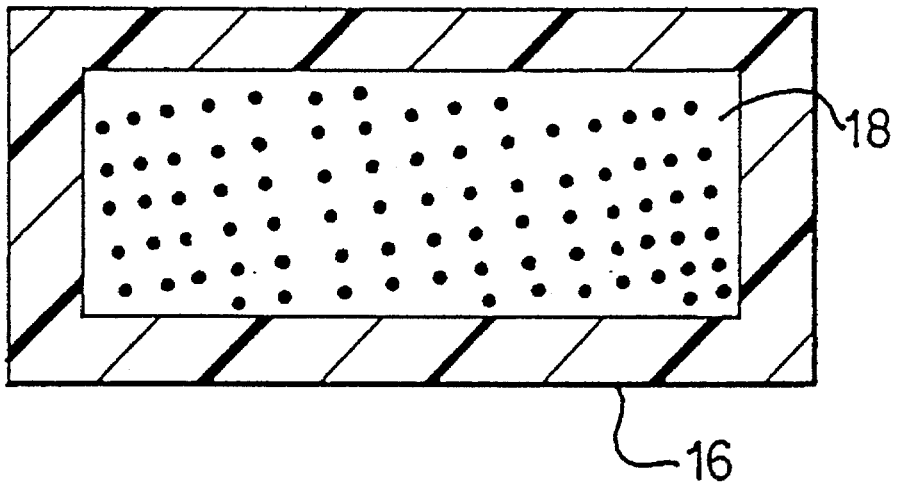
FIG. 4 is a plan view of the bottom component 16 of the LCD.

Referring now to FIG. 2 of the drawings, the present invention comprises LCD 10 which consists essentially of encased liquid 12 sandwiched between top section 14, and bottom section 16. A series of pixels 18 are positioned on the interior bottom section of component 16. Each of the pixels are individually responsive to the signal from the computer. The LCD IS commercially available from Sharp Electronics. The liquid emcompassed in the LCD is proprietary.

Clear wire 20 runs through the crystal. When a current is applied to the pixels the liquid becomes opaque along the wire. By connecting the wire to a computer or controller, specific areas of the LCD can be turned on or off. The computer controls which areas of the LCD are opaque, thus creating a mask. If a change is to be made to the mask, the computer turns off certain areas of the LCD and/or turns on other areas. This will allow rapid change in the design, while allowing the high speed patterning available with the photomask method of patterning .

The alignments system comprises light source 26 positioned above LCD means 14. The light source may have shade means 28 to direct and restrict the light to the LCD means. The LCD means are suitable connected to power and computer means 30. The work piece 32 (wafer) is positioned a suitable distance beneath the LCD means.

In operation, the mask design is entered into computer controller 30. Work piece 32 (substrate) is aligned into the system. The mask from the computer is fed into programmable mask 14. The programmable mask is aligned with the work piece using alignment marks programmed into the pattern data. The work piece is exposed through the programmable mask by means of lamp 26. The workpiece is removed, and the above steps are repeated for each different mask required to complete the mask.

There are several advantages in the utilization of the present invention. It is possible to perform several different chip design designs on one mask, thereby eliminating the need to produce a mask for layer of the circuit. Further, the mask can be printed directly on the individually controlled circurity. Although we have described our invention with a certain degree of particularity, it is understood that modification may be made without departing from the spirit and scope of the present invention as herein claimed.

Having described our invention, we claim:

1. A system for the production of an intergrated circuit comprising:

a computer, a programmable mask, a computer controller designed to feed a mask design into the programmable mask, a work piece aligned with the programmable mask, and means for exposing the work piece through the programmable mask.

2. A system in accordance with claim 1, wherein the programmable mask comprises a top and bottom component composed of a clear plastic, a clear liquid encompassed within the programmable mask at the midsection thereof, a series of pixels positioned in the interior of the bottom component of the programmable mask so as to react with the liquid on command from the computer.

3. A method for the production of intergrated circuits for the production of intergrated circuits comprising the steps of:

entering a mask design into a computer controller, feeding mask from the computer controller into a programmable mask, aligning the programmable mask with a work piece, and exposing the work piece through the programmable mask.

* * * * *